United States Patent
Mizuochi et al.

(10) Patent No.: US 7,917,833 B2
(45) Date of Patent: Mar. 29, 2011

(54) COMMUNICATION APPARATUS, TRANSMITTER, RECEIVER, AND ERROR CORRECTION OPTICAL COMMUNICATION SYSTEM

(75) Inventors: Takashi Mizuochi, Tokyo (JP); Naoki Suzuki, Tokyo (JP); Seiji Kozaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1026 days.

(21) Appl. No.: 11/682,753

(22) Filed: Mar. 6, 2007

(65) Prior Publication Data
US 2007/0162831 A1  Jul. 12, 2007

Related U.S. Application Data

(63) Continuation-in-part of application No. 11/278,274, filed on Mar. 31, 2006, now abandoned.

(30) Foreign Application Priority Data

Nov. 10, 2005  (JP) ................................. 2005-326565

(51) Int. Cl.
*H03M 13/00* (2006.01)
(52) U.S. Cl. ........................................ 714/776; 714/787
(58) Field of Classification Search .................. 714/701, 714/776, 787; 375/265
See application file for complete search history.

(56) References Cited

U.S. PATENT DOCUMENTS

| 4,665,537 | A | | 5/1987 | Moriyama | |
|---|---|---|---|---|---|
| 5,473,621 | A | * | 12/1995 | Wei | 714/784 |
| 5,889,791 | A | * | 3/1999 | Yang | 714/752 |
| 6,078,625 | A | * | 6/2000 | McCallister et al. | 375/261 |
| 6,606,718 | B1 | * | 8/2003 | Bessios | 714/701 |
| 2006/0245488 | A1 | | 11/2006 | Puputti et al. | |
| 2007/0140369 | A1 | * | 6/2007 | Limberg | 375/265 |

FOREIGN PATENT DOCUMENTS

| EP | 1 152 541 A1 | 11/2001 |
|---|---|---|
| GB | 2 402 307 | 12/2004 |
| JP | 2000-101451 | 4/2000 |
| JP | 2001-168734 | 6/2001 |
| JP | 2003-273841 | 9/2003 |
| JP | 2006-526350 | 11/2006 |
| WO | WO 01/43291 A1 | 6/2001 |
| WO | WO 2004/079956 A1 | 9/2004 |
| WO | WO 2004/107619 A1 | 12/2004 |

OTHER PUBLICATIONS

"Forward Error Correction for Submarine Systems"; ITU-T Recommendation G.975, Oct. 2000; pp. 1-15 and cover page.

(Continued)

*Primary Examiner* — Sam Rizk
(74) *Attorney, Agent, or Firm* — Oblon, Spivak, McClelland, Maier & Neustadt, L.L.P.

(57) ABSTRACT

A communication apparatus includes a transmitter and a receiver, wherein the transmitter further includes: an interleaver that rearranges positions of bits of an information frame; an FEC encoder that performs an error correction encoding to the information frame whose bit positions have been rearranged; and a selector that inserts FEC parity into predetermined positions of the information frame, to thereby generate a transmission signal, whereas the receiver includes: a selector that extracts an information frame part and an FEC parity part from a reception signal; an interleaver that rearranges positions of the bits of the information frame part using the same rule as that used at that transmitter side; an FEC decoder that corrects an error of bits rearranged based on the error correction parity part; and a de-interleaver that reproduces an information frame by returning positions of error-corrected bits to original bit positions.

40 Claims, 6 Drawing Sheets

OTHER PUBLICATIONS

"IEEE Draft P802.3ah ™/D3.0 (Amendment to IEEE Std 802.3-2002 ™)"; Institute of Electrical and Electronics Engineers, Inc., Dec. 5, 2003; pp. 515-519 and cover page.
L. Rennie, "Operation, Cost and Legacy Compatability" IEEE, Mar. 2002, pp. 1-10.

Ariel Maislos, et al. "Improving Frame FEC Efficiency Using Frame Bursts", IEEE, Sep. 2002, 10 Pages.

European Search Report issued Dec. 2, 2010 in PCT/JP2006321955.

* cited by examiner

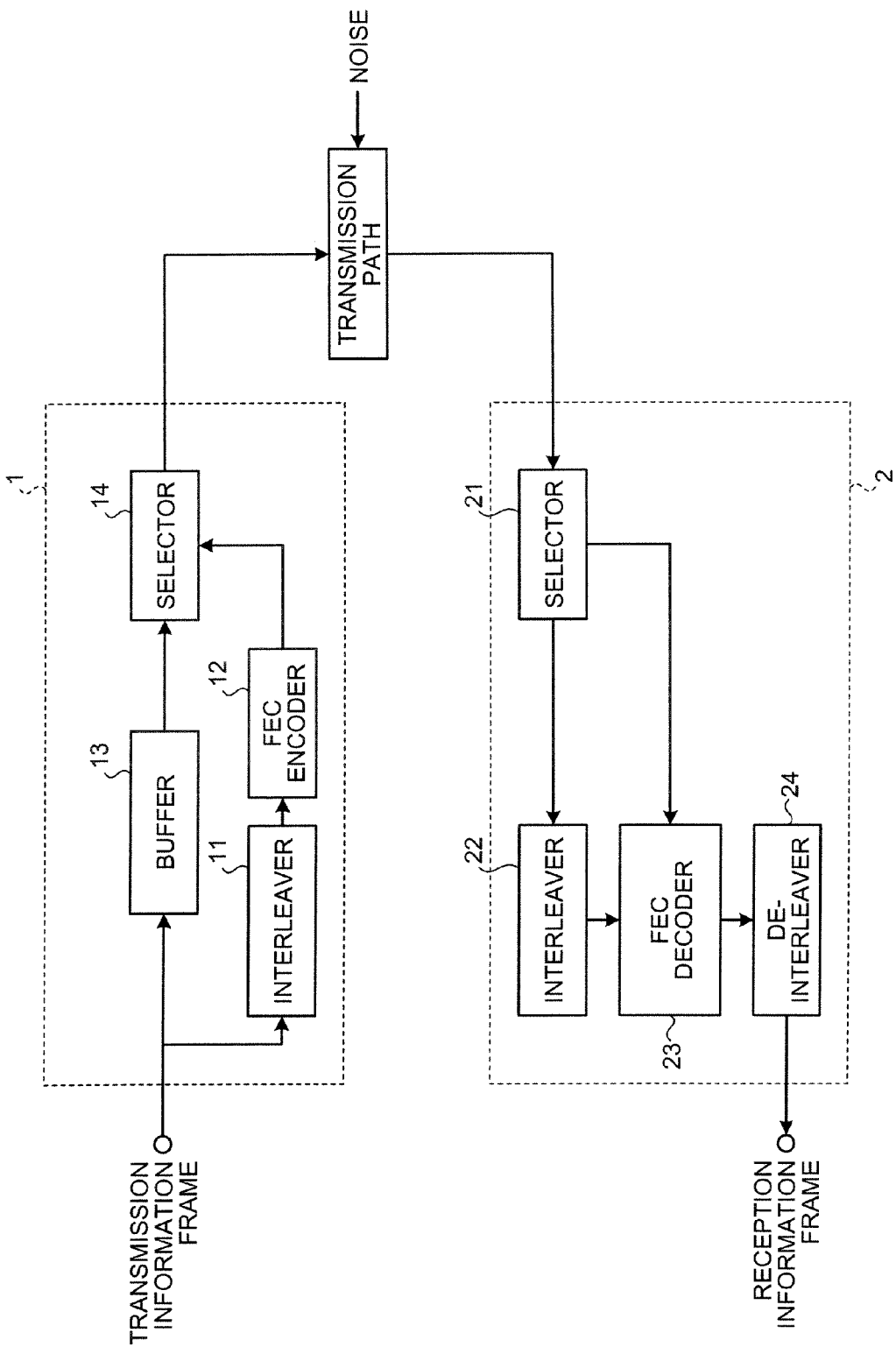

SENDING INFORMATION

AFTER INTERLEAVING & FEC ENCODING AT TRANSMITTER

AFTER SELECTOR AT TRANSMITTER

AFTER INTERLEAVING AT RECEIVER

AFTER FEC DECODING AT RECEIVER

AFTER DE-INTERLEAVING AT RECEIVER

SENDING INFORMATIONS

AFTER FRAMER

AFTER INTERLEAVING & FEC ENCODING AT TRANSMITTER

AFTER SELECTOR AT TRANSMITTER

AFTER INTERLEAVING AT RECEIVER

AFTER FEC DECODING AT RECEIVER

AFTER DE-INTERLEAVING AT RECEIVER

AFTER DEFRAMER

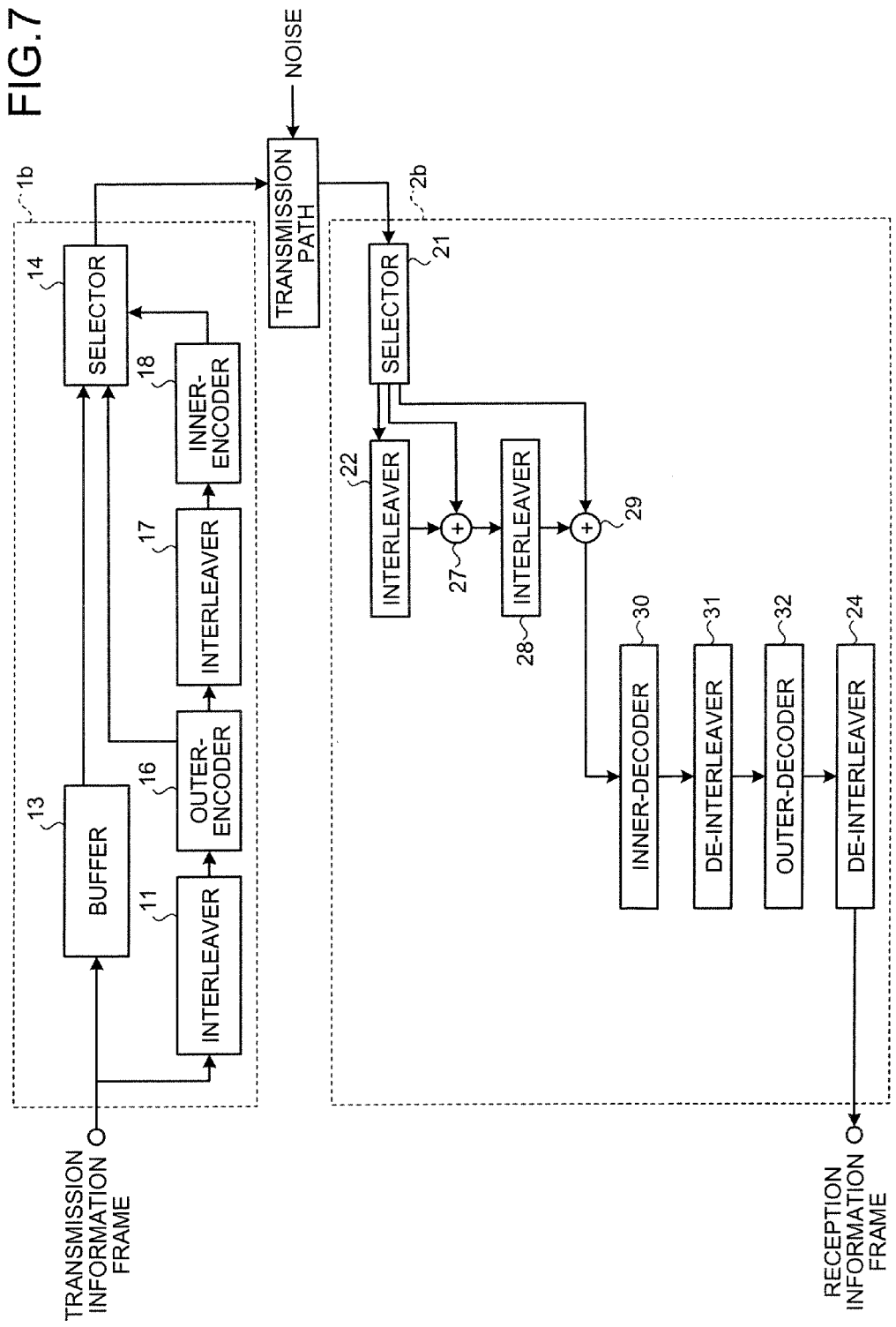

COMMUNICATION APPARATUS, TRANSMITTER, RECEIVER, AND ERROR CORRECTION OPTICAL COMMUNICATION SYSTEM

CROSS REFERENCE TO RELATED APPLICATIONS

This application is a continuation-in-part of U.S. application Ser. No. 11/278,274 filed on Mar. 31, 2006, which claims priority to Japanese Patent Application No. 2005-326565 filed on Nov. 10, 2005. The contents of each of these documents are incorporated herein by reference.

BACKGROUND OF THE INVENTION

1. Field of the Invention

The present invention relates to an error correction optical communication system having a forward error correction (FEC) function, and, more particularly to an error correction optical communication system that transmits and receives a non-interleaved information frame.

2. Description of the Related Art

An optical access system, a so-called "Fiber To The Home (FTTH)", that transmits large-capacity information to houses and offices, is being distributed rapidly. Among others, the service of "Gigabit Ethernet (registered trademark, and hereinafter referred to as "Ethernet®") PON (normally known as GE-PON)" that uses a "Passive Optical Network (PON)" system is being spread rapidly as a method of connecting Gigabit Ethernet® between a telecommunications house and plural users, since specifications are standardized in the IEEE Std 802.3ah.

The GE-PON has a configuration that an "Optical Line Terminal (OLT)" as a station-side device and an "Optical Network Unit (ONU)" as a user-side device are connected in two directions with one optical fiber via an optical branch unit. A point-to-multipoint connection, for example, a connection between one OLT and 32 ONUs, is made possible by carrying out a burst transmission and reception in which a time slot is shared among users.

According to the GE-PON, the optical branch unit branches power. Therefore, the optical power that each ONU receives is attenuated to one to the number of branches, and light that the OLT receives from each ONU is also attenuated to one to the number of branches. Consequently, a bit error is likely to occur. Furthermore, the fact that a laser diode having low performance is being used to decrease the cost is also likely to cause this bit error problem. To solve these problems, each of the OLT and the ONU is equipped with the FEC function, and a system of correcting bit errors whose amount is smaller than that the FEC can correct is standardized in the IEEE Std 802.3ah.

The FEC prescribed by the "IEEE Std 802.3ah." is Reed-Solomon (255, 239). According to this FEC, 16-byte error correction symbols (hereinafter, "FEC parity") are added to 239-byte information data symbols, thereby structuring a block of "239+16=255" bytes. When the Ethernet® data is smaller than 239 bytes, "zeros" are filled in the data to satisfy 239 bytes. A starting sequence and an ending sequence are added before and after the FEC parity to be added. When the system does not use the FEC, the added FEC parity is disregarded, thereby carrying out communications without changing the conventional device.

The Reed-Solomon (255, 239) error correction system has a capacity to be able to correct up to eight byte errors. In other words, the Reed-Solomon (255, 239) error correction system can correct all bit errors when the error is within eight bytes among 255 bytes. However, when a bit error occurs extending to nine bytes, the Reed-Solomon (255, 239) cannot correct the error. In a transmission path of actual optical communications, bit errors occur continuously in some cases, due to a fluctuation of polarization, non-linearity of an optical fiber, or insufficient performance of a transmitter/receiver. Even when the total number of bit errors that occur during a predetermined time is equal to or smaller than the number of bit errors that the Reed-Solomon (255, 239) error correction system can correct, the errors cannot be corrected when these bit errors are burst errors that occur during a short period of time. To solve this problem, there is a method of randomizing the occurrence of bit errors so that the bit errors do not occur in burst. This method is disclosed in the ITU-T Recommendation G.975, for example.

According to the FEC system disclosed in the ITU-T Recommendation G.975, an FEC encoder adds the FEC parity to a transmission information frame, and thereafter, an interleaver changes the order of bits, at the transmission side. On the other hand, at the reception side, a process opposite to that carried out at the transmission side is carried out. In other words, a de-interleaver and an FEC decoder are used to reproduce the transmission information frame. According to the ITU-T Recommendation G.975, the bit order is changed within 16 codewords. For example, when a continuous burst error of 512 bits occurs in a transmission path, 16 codewords are returned to an original bit string in a de-interleaver at the reception side, and the error is input as a continuous error of 32 bits (obtained by 512/16), to the FEC decoder. In this case, the continuous 32 bits become equal to or smaller than five bytes. Therefore, the Reed-Solomon (255, 239) error correction system can correct all errors.

In the "IEEE Std 802.3ah" document, the standard GE-PON device has both systems using the FEC and the system not using the FEC. Therefore, an interleave operation of the Ethernet® data series is not carried out. This is because when the interleave of the Ethernet® data series is carried out, a system that does not have a de-interleaver (not using the FEC) at the reception side cannot receive the data. Therefore, according to the Reed-Solomon (255, 239) error correction system that does not carry out interleaving of the Ethernet® data series, even when one bit error occurs for each nine bytes within one block in the Reed-Solomon (255, 239), this block cannot be corrected in the worst case. Consequently, the Ethernet® packet is discarded by an Ethernet® frame check sequence. In other words, the burst error tolerance is considerably low.

On the other hand, systems called a junction code and a product code, each constituted by two or more codewords, are known as a method of increasing the error correction capacity. However, each codeword needs to be interleaved, and there arises a problem that a decoding cannot be achieved correctly by merely disregarding an added FEC parity.

SUMMARY OF THE INVENTION

It is an object of the present invention to at least solve the problems in the conventional technology.

According to an aspect of the present invention, a communication apparatus that includes a transmitting unit and a receiving unit each of which has an error correction function, and transmits and receives respectively a information frame sufficiently longer than a codeword. The transmitting unit includes a first interleaver that rearranges positions of bits in an information frame based on a predetermined rule; an error correction encoder that carries out an error correction encoding to the information frame whose bit positions have been rearranged; and a transmission signal generator that inserts error correction parities obtained by the encoding operation into predetermined positions of the information frame, thereby generating a transmission signal. The receiving unit includes a reception signal extractor that receives the transmission signal and extracts a part corresponding to the information frame and the other part corresponding to the error correction parities, from the thus received transmission signal; a second interleaver that rearranges positions of the bits in the information frame part based on the same rule as that of the first interleaver; a decoder that corrects an error of bits rearranged by the second interleaver, based on the error correction parity part; and a de-interleaver that reproduces an information frame by returning positions of the error-corrected bits to the original bit positions.

According to another aspect of the present invention, a communication apparatus includes a transmitting unit and a receiving unit each of which has an error correction function, and transmits and receives respectively an information frame that is sufficiently short to an extent that a burst error cannot be corrected satisfactorily when the information frame is interleaved as a single frame. The transmitting unit includes a first frame generator that generates a frame sufficiently longer than a codeword, by combining a plurality of information frames; a first interleaver that rearranges positions of bits in the frame generated by the first frame generator, based on a predetermined rule; an error correction encoder that carries out an error correction encoding to the frame whose bit positions have been rearranged; and a transmission signal generator that inserts error correction parities obtained by the encoding operation, into predetermined positions of the information frame. The receiving unit includes a reception signal extractor that receives the transmission signal and extracts a part corresponding to the information frame and the other part corresponding to the error correction parities, from the thus received transmission signal; a second frame generator that generates a frame sufficiently longer than a codeword, by combining a plurality of information frames; a second interleaver that rearranges positions of bits in the frame generated by the second frame generator, based on the same rule as that used by the first interleaver; a decoder that corrects an error of bits rearranged by the second interleaver, based on the error correction parity part; a de-interleaver that returns positions of the error-corrected bits to the original bit positions; and a frame divider that divides the error-corrected frame obtained by the de-interleaver, into a plurality of the original information frames.

According to still another aspect of the present invention, a transmitter that transmits an information frame sufficiently longer than a codeword includes an interleaver that rearranges positions of bits in an information frame based on a predetermined rule; an error correction encoder that carries out an error correction encoding to the information frame whose bit positions have been rearranged; and a transmission signal generator that inserts error correction parities obtained by encoding into predetermined positions in the information frame, thereby generating a transmission signal.

According to still another aspect of the present invention, a transmitter that transmits an information frame that is sufficiently short to an extent that a burst error cannot be corrected satisfactorily when the information frame is interleaved as a single frame, includes a frame generator that generates a frame sufficiently longer than a codeword, by combining a plurality of information frames; an interleaver that rearranges positions of bits in the frame generated by the frame generator, based on a predetermined rule; an error correction encoder that carries out an error correction encoding to the frame whose bit positions have been rearranged; and a transmission signal generator that inserts error correction parities obtained by the encoding operation, into predetermined positions of the information frame.

According to still another aspect of the present invention, a receiver that has an error correction function, and receives an information frame sufficiently longer than a codeword includes a reception signal extractor that extracts a part corresponding to an information frame and a part corresponding to an error correction parity, from a reception signal; an interleaver that rearranges positions of the bits in the information frame part, based on the same rule as that used at a transmitter side; a decoder that corrects an error of bits rearranged by the interleaver, based on the error correction parity part; and a de-interleaver that reproduces an information frame by returning positions of the error-corrected bits to the original bit positions.

According to still another aspect of the present invention, a receiver that has an error correction function, and receives an information frame that is sufficiently short to an extent that a burst error cannot be corrected satisfactorily when the information frame is interleaved as a single frame, includes a reception signal extractor that extracts a part corresponding to an information frame and a part corresponding to a plurality of error correction parities, from a reception signal; a frame generator that generates a frame sufficiently longer than a codeword, by combining a plurality of information frames; an interleaver that rearranges positions of bits in the frame generated by the frame generator, based on the same rule as that used at a transmitter side; a decoder that corrects an error of bits rearranged by the interleaver, based on the error correction parity part; a de-interleaver that returns positions of the error-corrected bits to the original bit positions; and a frame divider that divides the error-corrected frame obtained by the de-interleaver, into a plurality of original information frames.

According to still another aspect of the present invention, an error-correction optical communication system includes a transmitting unit and a receiving unit each of which has an error correction function, and transmits and receives respectively a information frame sufficiently longer than a codeword. The transmitting unit includes a first interleaver that rearranges positions of bits in an information frame based on a predetermined rule; an error correction encoder that carries out an error correction encoding to the information frame whose bit positions have been rearranged; and a transmission signal generator that inserts error correction parities obtained by the encoding operation into predetermined positions of the information frame, thereby generating a transmission signal. The receiving unit includes a reception signal extractor that receives the transmission signal and extracts a part corresponding to the information frame and the other part corresponding to the error correction parities, from the thus received transmission signal; a second interleaver that rearranges positions of the bits in the information frame part based on the same rule as that of the first interleaver; a decoder that corrects an error of bits rearranged by the second interleaver, based on the error correction parity part; and a de-interleaver that reproduces an information frame by returning positions of the error-corrected bits to the original bit positions.

According to still another aspect of the present invention, an error-correction optical communication system includes a transmitting unit and a receiving unit each of which has an error correction function, and transmits and receives respectively an information frame that is sufficiently short to an extent that a burst error cannot be corrected satisfactorily when the information frame is interleaved as a single frame.

The transmitting unit includes a first frame generator that generates a frame sufficiently longer than a codeword, by combining a plurality of information frames; a first interleaver that rearranges positions of bits in the frame generated by the first frame generator, based on a predetermined rule; an error correction encoder that carries out an error correction encoding to the frame of whose bit positions have been rearranged; and a transmission signal generator that inserts error correction parities obtained by the encoding operation, into predetermined positions of the information frame. The receiving unit includes a reception signal extractor that receives the transmission signal and extracts a part corresponding to the information frame and the other part corresponding to the error correction parities, from the thus received transmission signal; a second frame generator that generates a frame sufficiently longer than a codeword, by combining a plurality of information frames; a second interleaver that rearranges positions of bits in the frame generated by the second frame generator, based on the same rule as that used by the first interleaver; a decoder that corrects an error of bits rearranged by the second interleaver, based on the error correction parity part; a de-interleaver that returns positions of the error-corrected bits to the original bit positions; and a frame divider that divides the error-corrected frame obtained by the de-interleaver, into a plurality of the original information frames.

According to still another aspect of the present invention, a communication apparatus includes a transmitting unit and a receiving unit each of which has an error correction function, and transmits and receives respectively an information frame sufficiently longer than a codeword. The transmitting unit includes a first interleaver that rearranges positions of bits in an information frame based on a predetermined rule; a first error correction encoder that carries out an error correction encoding using an outer code to the information frame whose bit positions have been rearranged; a second interleaver that rearranges bit positions of the output of the first error correction encoder based on a predetermined rule; a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal. The receiving unit includes a reception signal extractor that receives the transmission signal, and extracts a part corresponding to the information frame, a part corresponding to the first error correction parity, and a part corresponding to the second error correction parity, from the thus received transmission signal; a third interleaver that rearranges positions of the bits in the information frame part based on the same rule as that of the first interleaver; a first adder that inserts a first error correction parity extracted by the reception signal extractor into the signals rearranged by the third interleaver; a fourth interleaver that rearranges the output of the first adder based on the same rule as that of the second interleaver; a second adder that inserts a second error correction parity extracted by the reception signal extractor into the signals rearranged by the fourth interleaver; a first decoder that corrects an error of the output of the second adder, using the second error correction parity included in the processed output; a first de-interleaver that rearranges the signals of which error is corrected by the first decoder, in the order opposite to that of the rearrangement executed by the second interleaver; a second decoder that corrects an error of the output of the first de-interleaver, using the first error correction parity included in the processed output; and the second de-interleaver that reproduces an information frame by returning positions of the error-corrected bits to the original bit positions by rearranging the signals of which error is corrected by the output of the second decoder, in the order opposite to that of the rearrangement executed by the first interleaver.

According to still another aspect of the present invention, a communication apparatus includes a transmitting unit and a receiving unit each of which has an error correction function, and transmits and receives respectively an information frame that is sufficiently short to an extent that a burst error cannot be corrected satisfactorily when the information frame is interleaved as a single frame. The transmitting unit includes a first frame generator that generates a frame sufficiently longer than a codeword by combining a plurality of information frames; a first interleaver that rearranges positions of bits in an information frame generated by the first frame generator, based on a predetermined rule; a first error correction encoder that carries out an error correction encoding using an outer code to the information frame whose bit positions have been rearranged; a second interleaver that rearranges bit positions of the output of the first error correction encoder based on a predetermined rule; a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal. The receiving unit includes a reception signal extractor that receives the transmission signal, and extracts a part corresponding to the information frame, a part corresponding to the first error correction parity, and a part corresponding to the second error correction parity, from the thus received transmission signal; a second frame generator that generates a frame sufficiently longer than a codeword by combining a plurality of information frames; a third interleaver that rearranges positions of the bits in the information frame generated by the second frame generator, based on the same rule as that of the first interleaver; a first adder that inserts a first error correction parity extracted by the reception signal extractor into the signals rearranged by the third interleaver; a fourth interleaver that rearranges the output of the first adder based on the same rule as that of the second interleaver; a second adder that inserts a second error correction parity extracted by the reception signal extractor into the signals rearranged by the fourth interleaver; a first decoder that corrects an error of the output of the second adder, using the second error correction parity included in the processed output; a first de-interleaver that rearranges the signals of which error is corrected by the first decoder, in the order opposite to that of the rearrangement executed by the second interleaver; a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

According to still another aspect of the present invention, a transmitter that transmits an information frame sufficiently longer than a codeword includes a first interleaver that rearranges positions of bits in an information frame based on a predetermined rule; a first error correction encoder that carries out an error correction encoding using an outer code to the information frame whose bit positions have been rearranged; a second interleaver that rearranges bit positions of the output of the first error correction encoder based on a predetermined rule; a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal.

According to still another aspect of the present invention, a receiver that has an error correction function and that receives a signal transmitted from the above transmitter includes a reception signal extractor that receives the transmission signal, and extracts a part corresponding to the information frame, a part corresponding to the first error correction parity, and a part corresponding to the second error correction parity, from the thus received transmission signal; a third interleaver that rearranges positions of the bits in the information frame, based on the same rule as that of the first interleaver; a first adder that inserts a first error correction parity extracted by the reception signal extractor into the signals rearranged by the third interleaver; a fourth interleaver that rearranges the output of the first adder based on the same rule as that of the second interleaver; a second adder that inserts a second error correction parity extracted by the reception signal extractor into the signals rearranged by the fourth interleaver; a first decoder that corrects an error of the output of the second adder, using the second error correction parity included in the processed output; a first de-interleaver that rearranges the signals of which error is corrected by the first decoder, in the order opposite to that of the rearrangement executed by the second interleaver; a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

According to still another aspect of the present invention, a transmitter that transmits an information frame that is sufficiently short to an extent that a burst error cannot be corrected satisfactorily when the information frame is interleaved as a single frame, includes a first frame generator that generates a frame sufficiently longer than a codeword by combining a plurality of information frames; a first interleaver that rearranges positions of bits in an information frame generated by the first frame generator, based on a predetermined rule; a first error correction encoder that carries out an error correction encoding using an outer code to the information frame whose bit positions have been rearranged; a second interleaver that rearranges bit positions of the output of the first error correction encoder based on a predetermined rule; a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal.

According to still another aspect of the present invention, a receiver that has an error correction function and that receives a signal transmitted from the above transmitter includes a reception signal extractor that receives the transmission signal, and extracts a part corresponding to the information frame, a part corresponding to the first error correction parity, and a part corresponding to the second error correction parity, from the thus received transmission signal; a second frame generator that generates a frame sufficiently longer than a codeword by combining a plurality of information frames; a third interleaver that rearranges positions of the bits in the information frame generated by the second frame generator, based on the same rule as that of the first interleaver; a first adder that inserts a first error correction parity extracted by the reception signal extractor into the signals rearranged by the third interleaver; a fourth interleaver that rearranges the output of the first adder based on the same rule as that of the second interleaver; a second adder that inserts a second error correction parity extracted by the reception signal extractor into the signals rearranged by the fourth interleaver; a first decoder that corrects an error of the output of the second adder, using the second error correction parity included in the processed output; a first de-interleaver that rearranges the signals of which error is corrected by the first decoder, in the order opposite to that of the rearrangement executed by the second interleaver; a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

According to still another aspect of the present invention, an error correction optical communication system has an error correction function, and transmits and receives respectively an information frame sufficiently longer than a codeword. A communication apparatus at an information frame transmission side includes a first interleaver that rearranges positions of bits in an information frame based on a predetermined rule; a first error correction encoder that carries out an error correction encoding using an outer code to the information frame whose bit positions have been rearranged; a second interleaver that rearranges bit positions of the output of the first error correction encoder based on a predetermined rule; a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal. Moreover, a communication apparatus at an information frame reception side includes a reception signal extractor that receives the transmission signal, and extracts a part corresponding to the information frame, a part corresponding to the first error correction parity, and a part corresponding to the second error correction parity, from the thus received transmission signal; a third interleaver that rearranges positions of the bits in the information frame part based on the same rule as that of the first interleaver; a first adder that inserts a first error correction parity extracted by the reception signal extractor into the signals rearranged by the third interleaver; a fourth interleaver that rearranges the output of the first adder based on the same rule as that of the second interleaver; a second adder that inserts a second error correction parity extracted by the reception signal extractor into the signals rearranged by the fourth interleaver; a first decoder that corrects an error of the output of the second adder, using the second error correction parity included in the processed output; a first de-interleaver that rearranges the signals of which error is corrected by the first decoder, in the order opposite to that of the rearrangement executed by the second interleaver; a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

According to still another aspect of the present invention, an error correction optical communication system has an error correction function, and transmits and receives respectively an information frame that is sufficiently short to an extent that a burst error cannot be corrected satisfactorily when the information frame is interleaved as a single frame. A communication apparatus at an information frame transmission side includes a first frame generator that generates a frame sufficiently longer than a codeword by combining a plurality of information frames; a first interleaver that rearranges positions of bits in an information frame generated by the first frame generator, based on a predetermined rule; a first error correction encoder that carries out an error correction encoding using an outer code to the information frame whose bit positions have been rearranged; a second interleaver that rearranges bit positions of the output of the first error correction encoder based on a predetermined rule; a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal. A communication apparatus at an information frame reception side includes a reception signal extractor that receives the transmission signal, and extracts a part corresponding to the information frame, a part corresponding to the first error correction parity, and a part corresponding to the second error correction parity, from the thus received transmission signal; a second frame generator that generates a frame sufficiently longer than a codeword by combining a plurality of information frames; a third interleaver that rearranges positions of the bits in the information frame generated by the second frame generator, based on the same rule as that of the first interleaver; a first adder that inserts a first error correction parity extracted by the reception signal extractor into the signals rearranged by the third interleaver; a fourth interleaver that rearranges the output of the first adder based on the same rule as that of the second interleaver; a second adder that inserts a second error correction parity extracted by the reception signal extractor into the signals rearranged by the fourth interleaver; a first decoder that corrects an error of the output of the second adder, using the second error correction parity included in the processed output; a first de-interleaver that rearranges the signals of which error is corrected by the first decoder, in the order opposite to that of the rearrangement executed by the second interleaver; a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a configuration example of an error correction optical communication system according to a first embodiment of the present invention;

FIG. 7 is a configuration example of an error correction optical communication system according to a fifth embodiment of the present invention.

DETAILED DESCRIPTION OF THE PREFERRED EMBODIMENTS

Figure 2A:
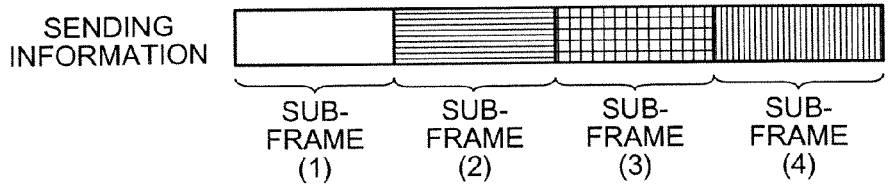
FIG. 2A is an explanatory diagram of a flow of transmission and reception processes in the error correction optical communication system.

Exemplary embodiments according to the present invention are explained below in detail with reference to the accompanying drawings. Note that the invention is not limited to the embodiments.

FIG. 1 is a configuration example of an error correction optical communication system according to a first embodiment of the present invention. The error correction optical communication system according to the first embodiment includes a transmitter 1 as a communication apparatus at a transmission side, and a receiver 2 as a communication apparatus at a reception side. The transmitter 1 includes an interleaver 11, and an FEC encoder 12, a buffer 13 and a selector 14. The receiver 2 includes a selector 21, an interleaver 22, an FEC decoder 23 and a de-interleaver 24. In the first embodiment, communications are carried out in one direction from the transmitter 1 to the receiver 2 to simplify the explanation. However, in the actual system, each communication apparatus has both a transmitter and a receiver, and can achieve communications in both directions.

In FIG. 1, the transmitter 1 branches a received transmission information frame into two. In one path, the interleaver 11 changes the order of the bits that constitute the transmission information frame, based on a predetermined rule, and the FEC encoder 12 carries out an error correction encoding, thereby generating an FEC parity. In the other path, the buffer 13 adds a delay to the transmission information frame for the time period required to carry out the interleave and the error correction. The selector 14 adds the FEC parity to a predetermined position of the transmission information frame received via the buffer 13, thereby generating a transmission signal.

On the other hand, the receiver 2 receives the transmission signal that receives the influence of noise in the transmission path. The selector 21 divides the received signal into an information frame part and an FEC parity part. The interleaver 22 changes the order of bits of the information frame part in the same order as that carried out by the interleaver 11 at the transmitter 1 side. Furthermore, the FEC decoder 23 carries out the error correction using the FEC parity extracted in the selector 21. Thereafter, the de-interleaver 24 returns the order of the bits of the error-corrected information frame to the original order. Finally, the de-interleaver 24 of the receiver 2 outputs the bits whose positions have been rearranged, as a reception information frame.

The operation of the error correction optical communication system is explained in detail below with reference to the drawings. FIGS. 2A to 2F are explanatory diagrams of a flow of transmission and reception processes in the error correction optical communication system. Specifically, the flow includes the encoding of a transmission information frame, and the reproduction of the reception information frame from the reception signal.

Figure 2B:
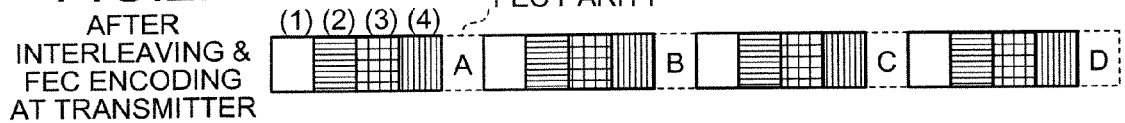
FIG. 2B is an explanatory diagram of a flow of transmission and reception processes in the error correction optical communication system.

FIG. 2A depicts one example of a transmission information frame. In this example, one transmission information frame is divided into four sub-frames (1) to (4). FIG. 2B depicts a bit string after the interleaver 11 and the FEC encoder 12 of the transmitter 1 carried out the process. The interleaver 11 divides the sub-frame into four sub-frames, and arranges the divided pieces in the order of the sub-frames 1 to 4. The FEC parities, corresponding to A, B, C, and D in FIG. 2B, are added respectively to the four-piece blocks after the interleaving operation is carried out. Each of the four-piece blocks and the FEC parities added to each of the four-piece blocks constitute one codeword. On the transmission path, the transmission signal (corresponding to the output of the selector 14) is transmitted in a state that the FEC parities are inserted into the four non-interleaved sub-frames.

Figure 2C:
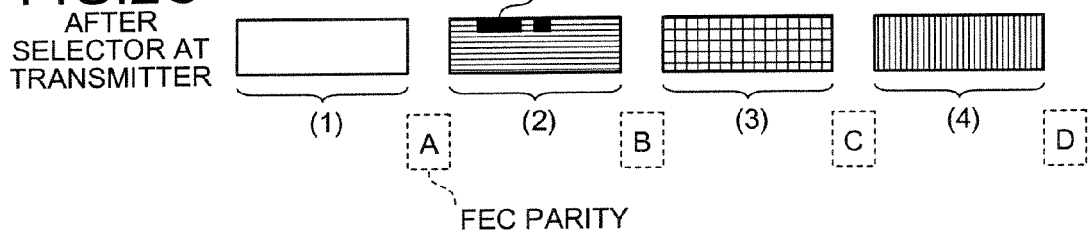
FIG. 2C is an explanatory diagram of a flow of transmission and reception processes in the error correction optical communication system.
Figure 2D:
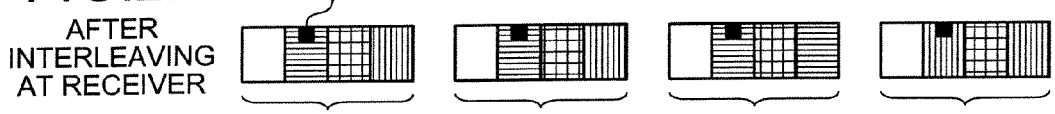
FIG. 2D is an explanatory diagram of a flow of transmission and reception processes in the error correction optical communication system.

FIG. 2C depicts the output of the selector 21 of the receiver 2. A state that a burst error has occurred in the sub-frame (2) due to a noise on the transmission path is shown. The selector 21 selectively outputs the sub-frame part (corresponding to the information frame part) and the FEC parity part. FIG. 2D depicts a state that the interleaver 22 of the receiver 2 changes the order of the bits. The order of the bits is changed based on the same rule as that used at the transmission side, and the burst error that has occurred in the sub-frame (2) is allocated to four different codewords.

Figure 2E:
FIG. 2E is an explanatory diagram of a flow of transmission and reception processes in the error correction optical communication system.
Figure 2F:
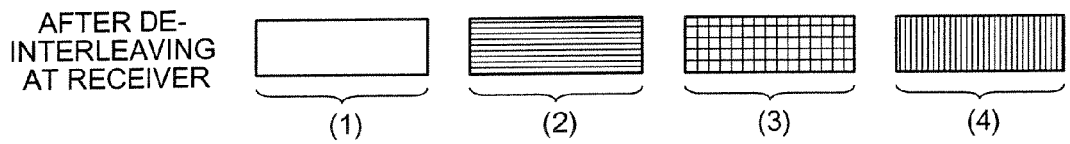
FIG. 2F is an explanatory diagram of a flow of transmission and reception processes in the error correction optical communication system.

FIG. 2E depicts a state that the FEC decoder 23 has corrected all the errors. For example, even when a burst error that cannot be corrected straight has occurred as shown in FIG. 2C, the interleaver 22 can correct the burst error by allocating the error to plural codewords. FIG. 2F depicts a state that the de-interleaver 24 has reproduced original sub-frames (1) to (4).

In the error correction optical communication system according to the first embodiment, it is important that the transmission information frame is sufficiently longer than the error correction codewords and those plural sub-frames can be interleaved. The method of interleaving is not limited to that described above, and the positions of the bits of the information frame can be rearranged based on any rule.

As explained above, according to the first embodiment, the communication apparatus at the transmission side generates the FEC parities using the interleaver and the FEC encoder, and inserts the FEC parities into the transmission information frame and sends this frame. The communication apparatus at the reception side extracts the error information frame and the FEC parities from the received signal. Furthermore, the interleaver rearranges the order of bits of the extracted information frame based on the same rule as that used at the transmission side. The FEC decoder corrects the information frame whose bit positions are rearranged, using the extracted FEC parities. Finally, the de-interleaver rearranges the bits of the error-corrected reception information frame, based on the rule opposite to the used above. The frame obtained as a result of rearranging the bits is output as the reproduced reception information frame. Consequently, a burst error can be corrected satisfactorily, without requiring the communication apparatus at the transmission side to send the interleaved signal.

An error correction optical communication system according to a second embodiment is explained below. The error correction optical communication system according to the second embodiment has the same configuration as that of the error correction optical communication system according to the first embodiment shown in FIG. 1.

Figure 3A:
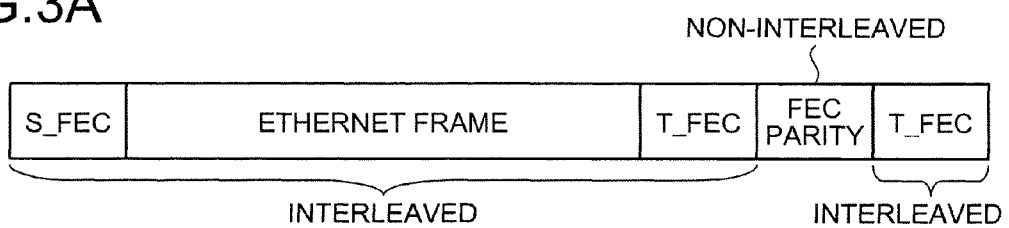
FIG. 3A is one example of an Ethernet® frame which is made an FEC frame.
Figure 3B:
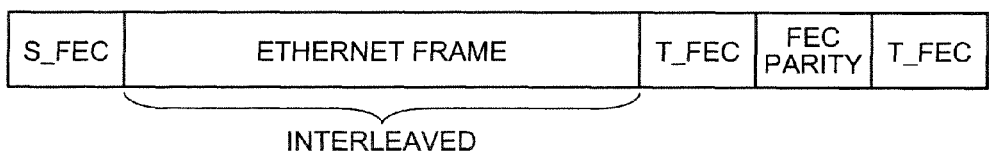
FIG. 3B is another example of an Ethernet® frame which is made an FEC frame.

FIGS. 3A and 3B depict an example of an Ethernet® frame which is made an FEC frame (codeword). In this case, the Ethernet® frame corresponds to the above transmission information frame. The Ethernet® frame is prescribed by the "IEEE Std 802.3ah."

Figure 4:
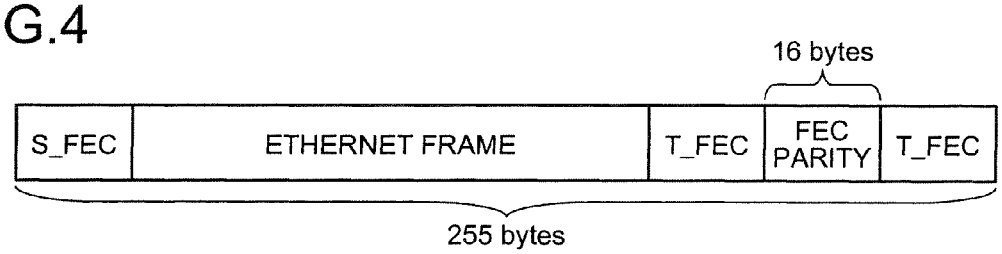
FIG. 4 is still another example of an Ethernet® frame which is made an FEC frame.

Specifically, FIG. 3A depicts that all areas other than the FEC parities are to be interleaved, and FIG. 3B depicts that only the Ethernet® frame is to be interleaved. In FIGS. 3A and 3B, S_FEC denotes a marker that expresses the head of the FEC frame, and T_FEC denotes a marker that expresses the tail of the FEC frame. The whole frames shown in FIGS. 3A and 3B correspond to one codeword, i.e., correspond to one of the four codewords shown in FIG. 2B. The FEC frames shown in FIG. 3A, FIG. 3B, and FIG. 4 are 8B-to-10B converted in the transmission path. A byte of eight bits that constitute the FEC frame and a byte as one unit of the 8B-to-10B conversion are byte-synchronized so that the header bits of these bytes coincide with each other. By carrying out the byte-synchronization, propagation of a bit error that has occurred in the transmission path to plural bytes of the FEC frames can be prevented. When an original Ethernet® frame (the Ethernet® frame before dividing) is not sufficiently longer than the codeword, the area which is short is filled with dummy bits by a virtual calculation of the FEC parity. The dummy bits are virtual, and are not actually present in the serial bit string to be transmitted to the transmission path.

As explained above, according to the second embodiment, when the Ethernet® frame is to be applied to the error correction optical communication system, it is made an FEC frame (codeword) as shown in FIGS. 3A and 3B. In other words, the Ethernet® frame is divided into plural sub-frames, and the plural sub-frames are interleaved as described above. Based on this arrangement, the same effect as that achieved in the first embodiment can be also achieved in the system using the Ethernet® frame.

An error correction optical communication system according to a third embodiment is explained below. The error correction optical communication system according to the third embodiment has the same configuration as that of the error correction optical communication system according to the first embodiment shown in FIG. 1. In the third embodiment, the Ethernet® frame that is made an FEC frame (codeword) is explained like in the second embodiment.

In the third embodiment, the Reed-Solomon (255, 239) error correction system is used as the FEC, thereby achieving excellent error correction capacity. FIG. 4 depicts one example in which the Ethernet® frame is made an FEC frame (codeword). In this example, 239 bytes include the Ethernet® frame, S_FEC, and T_FEC, and 16 bytes include the FEC parity. Accordingly, one codeword (corresponding to four codewords shown in FIG. 2B) is formed in the total 255 bytes. In the third embodiment, the Ethernet® frame is divided into sub-frames, and plural sub-frames are interleaved (as shown in FIGS. 2A and 2B), thereby generating the FEC parities, in a similar manner to that described above.

As explained above, in the third embodiment, the Reed-Solomon codes having a high error correction capacity are used as the FEC to the error correction optical communication system shown in the first embodiment. Based on this arrangement, the same effect as that achieved in the first and the second embodiments can be also achieved, and a general-purpose system can be obtained.

An error correction optical communication system according to a fourth embodiment is explained below. In the fourth embodiment, the error correction optical communication system can achieve a similar effect to that of the above embodiments, even in a case in which one transmission information frame is short, and thus a satisfactory burst error correction effect cannot be achieved when the transmission information frame is interleaved as a single frame. This is explained below.

Figure 5:
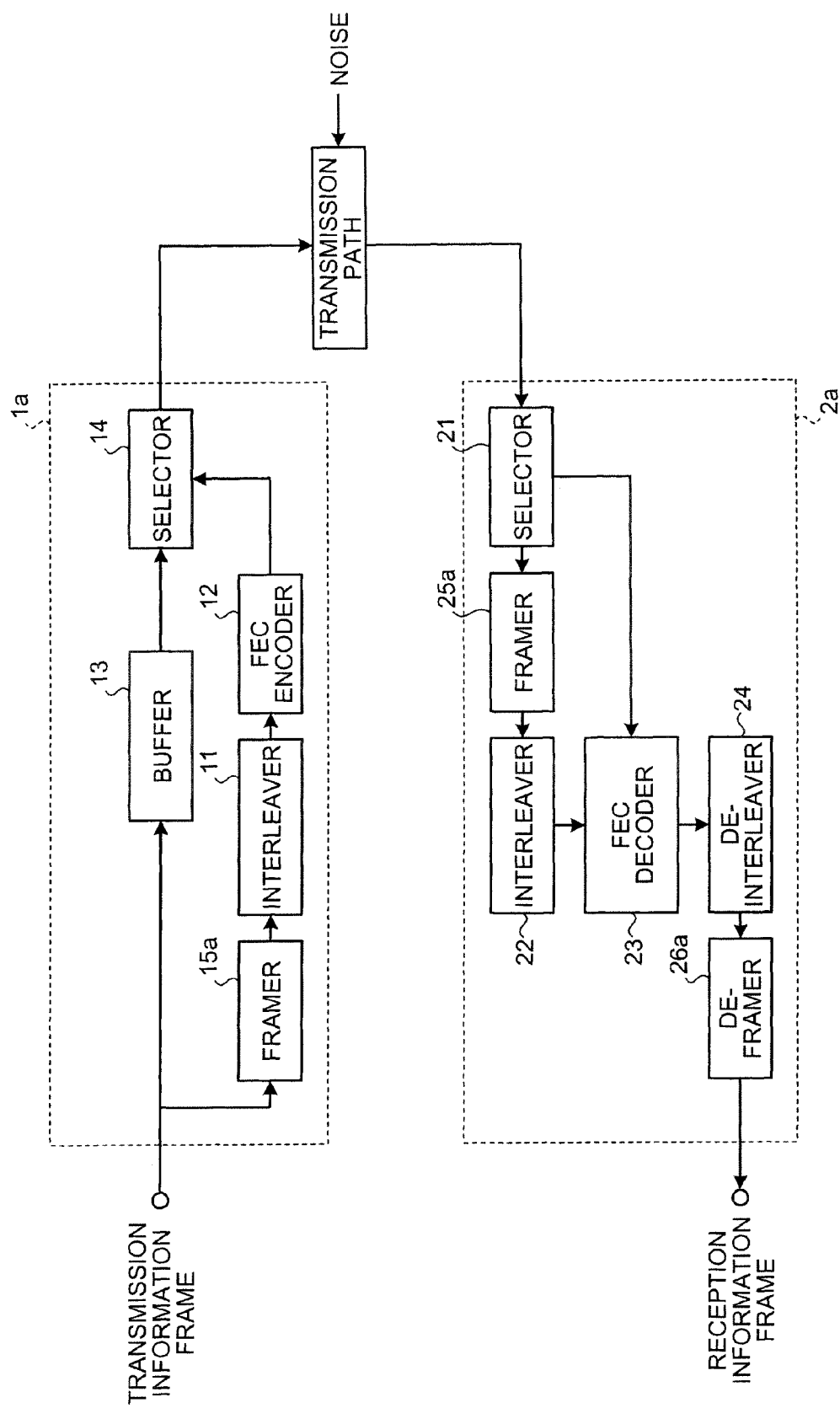
FIG. 5 is a configuration example of the error correction optical communication system.

FIG. 5 is a configuration diagram of the error correction optical communication system according to the fourth embodiment of the present invention. The error correction optical communication system according to the fourth embodiment includes a transmitter 1a as a communication apparatus at a transmission side, and a receiver 2a as a communication apparatus at a reception side. The transmitter 1a includes a framer 15a, in addition to the configuration of the first embodiment. The receiver 2a includes a framer 25a, and a de-framer 26a, in addition to the configuration of the first embodiment. Configurations similar to those explained in the first to the third embodiments are not explained herein.

In the fourth embodiment, even in a case in which one transmission information frame is short, and a satisfactory burst error correction effect cannot be achieved when the transmission information frame is interleaved as a single frame, a frame sufficiently longer than the codeword is formed by combining plural transmission information frames as in the above embodiments. The burst error is corrected using this long frame. Specifically, in FIG. 5, for example, the framers 15a and 25a generate one frame by combining plural short transmission frames. The de-framer 26a disassembles the bit string, which is de-interleaved by the de-interleaver 24 in advance, into an original short transmission information frame, thereby generating the reception information frame.

The operation of the error correction optical communication system according to the fourth embodiment is explained in detail below. FIGS. 6A to 6H are explanatory diagrams of a flow of transmission and reception processes in the error correction optical communication system according to the fourth embodiment. Specifically, the flow includes the encoding of a transmission information frame, and the reproduction of the reception information frame from the reception signal.

Figure 6A:
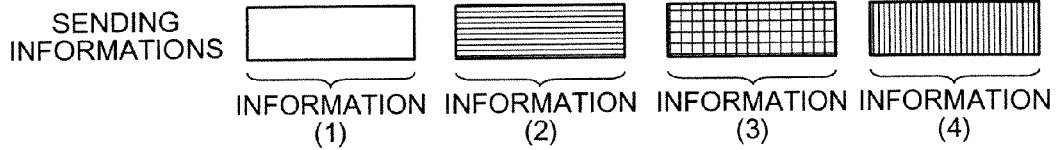
FIG. 6A is an explanatory diagram of a flow of transmission and reception processes in the error correction optical communication system.
Figure 6B:
FIG. 6B is an explanatory diagram of a flow of transmission and reception processes in the error correction optical communication system.
Figure 6C:
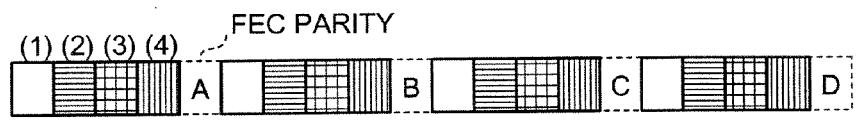
FIG. 6C is an explanatory diagram of a flow of transmission and reception processes in the error correction optical communication system.

FIG. 6A depicts one example of a transmission information frame. In this example, each of transmission information frames (1) to (4) (shown by "Information" in FIG. 6A) has only the same length as that of a codeword that constitutes an error correction code. FIG. 6B depicts an output of the framer 15a that combines the four transmission information frames to compose one frame. FIG. 6C depicts a bit string after the interleaver 11 and the FEC encoder 12 of the transmitter 1a carry out the process. The interleaver 11 divides the frame generated by the framer 15a, into four frames, and arranges the divided pieces in the order of 1 to 4. The FEC parities, corresponding to A, B, C, and D in FIG. 6A, are added respectively to the four-piece blocks after the interleaving operation is carried out. Each of the four-piece blocks and the FEC parities added to each of the four-piece blocks constitute one codeword. On the transmission path, the transmission signal, corresponding to the output of the selector 14, is transmitted in the state that the FEC parities are inserted into the four non-interleaved transmission information frames.

Figure 6D:
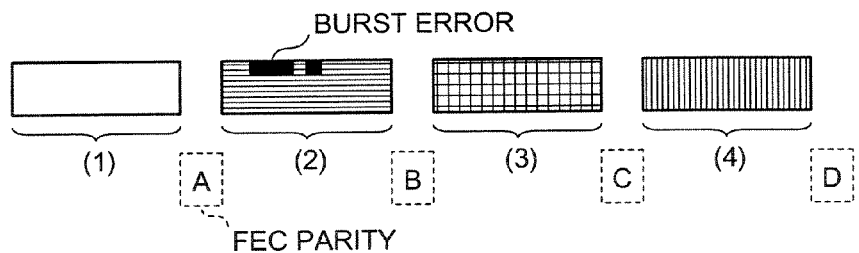
FIG. 6D is an explanatory diagram of a flow of transmission and reception processes in the error correction optical communication system.
Figure 6E:
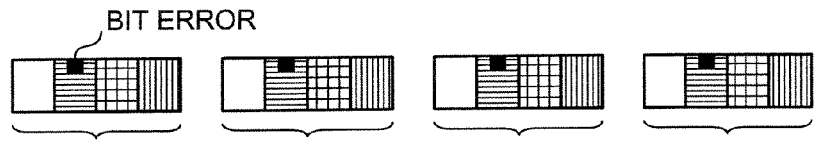
FIG. 6E is an explanatory diagram of a flow of transmission and reception processes in the error correction optical communication system.

FIG. 6D depicts the output of the selector 21 of the receiver 2a. A state that a burst error has occurred in the information frame (2) due to a noise on the transmission path is shown. The selector 21 selectively outputs the information frame part and the FEC parity part. FIG. 6E depicts a state that the interleaver 22 of the receiver 2a changes the order of the bits. The order of the bits is changed based on the same rule as that used at the transmission side, and the burst error that has occurred in the information frame (2) is allocated to four different codewords.

Figure 6F:
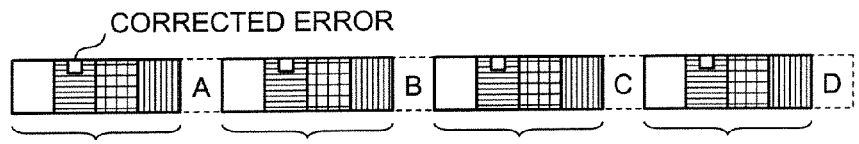
FIG. 6F is an explanatory diagram of a flow of transmission and reception processes in the error correction optical communication system.
Figure 6G:
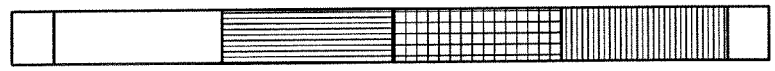
FIG. 6G is an explanatory diagram of a flow of transmission and reception processes in the error correction optical communication system.
Figure 6H:
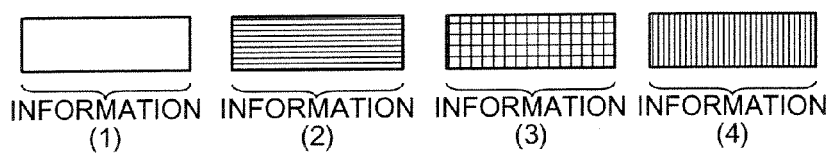
FIG. 6H is an explanatory diagram of a flow of transmission and reception processes in the error correction optical communication system.

FIG. 6F depicts a state that the FEC decoder 23 has corrected all the errors. Even when a burst error that cannot be corrected straight has occurred as shown in FIG. 6D, the interleaver 22 can correct the burst error by allocating the error into plural codewords. FIG. 6G depicts a state that the de-interleaver 24 has reproduced the original frame by combining the four transmission information frames. FIG. 6H depicts a state that the de-framer 26a divides the frame shown in FIG. 6G, thereby generating the reception information frame.

As explained above, according to the fourth embodiment, even in a case in which one transmission information frame is short, and thus a satisfactory burst error correction effect cannot be achieved when the transmission information frame is interleaved as a single frame, the framers 15a, 25a and the de-framer 26a can interleave the frame as plural transmission information frames. Accordingly, when a burst error as shown in FIG. 6D occurs, the burst error can be corrected satisfactorily, like in the above embodiments.

An error correction optical communication system according to a fifth embodiment of the present invention is explained next. FIG. 7 is a configuration example of the error correction optical communication system according to the fifth embodiment. The error correction optical communication system according to the fifth embodiment includes a transmitter 1b as a communication apparatus at the transmission side, and a receiver 2b as a communication apparatus at the reception side. The transmitter 1b includes an outer-encoder 16, an interleaver 17, and an inner-encoder 18, in addition to the configuration of the first embodiment. The receiver 2b includes adders 27 and 29, an interleaver 28, an inner-decoder 30, a de-interleaver 31, and an outer-decoder 32, in addition to the configuration of the first embodiment. In the fifth embodiment, communications are carried out in one direction from the transmitter 1b to the receiver 2b to simplify the explanation. However, in the actual system, each communication apparatus has both functions of a transmitter and a receiver, and can achieve communications in both directions.

As shown in FIG. 7, the transmitter 1b first branches a received transmission information frame into two paths. In one path, the interleaver 11 as a first interleaver changes the order of the bits that constitute the transmission information frame, based on a predetermined rule, and the outer-encoder 16 carries out an error correction encoding, thereby generating an FEC parity of an outer code. The interleaver 17 as a second interleaver changes the order of the bits that constitute the output (a transmission information frame that is error-correction-encoded after the interleaving) of the outer-encoder 16, based on a predetermined rule, and the inner-encoder 18 carries out an error correction encoding, thereby generating an FEC parity of an inner code.

In the other path, the buffer 13 adds a delay to the transmission information frame for the time period required to carry out the interleave and the error correction (the time required for the process carried out by the interleaver 11 to the inner-decoder 18). The selector 14 adds the FEC parity of the above-generated outer code and the FEC parity of the inner code, to a predetermined position of the transmission information frame received via the buffer 13, thereby generating a transmission signal.

On the other hand, the receiver 2b receives the transmission signal that is affected by noise in the transmission path. The selector 21 divides the received signal into an information frame part, an FEC parity part of the outer code, and an FEC parity part of the inner code. The interleaver 22 as a third interleaver changes the order of bits of the information frame part in the same order as the first interleave carried out by the interleaver 11 at the transmitter 1b side. Further, the adder 27 adds the FEC parity of the outer code (the FEC parity of the outer code allocated by the selector 21). Further, the interleaver 28 as a fourth interleaver changes the order of bits of the information frame part in the same order as the second interleave carried out by the interleaver 17 at the transmitter 1b side. Further, the adder 29 adds the FEC parity of the inner code (the FEC parity of the inner code allocated by the selector 21).

The inner-decoder 30 carries out the error correction using the FEC parity of the inner code. Thereafter, the de-interleaver 31 changes the order of bits of the information frame part in a rule opposite to that of the interleaver 17 (a rule to return the bits after the interleaving to a state before the interleaving). Further, the outer-decoder 32 carries out an error correction using the FEC parity of the outer code. Finally, the de-interleaver 24 returns the order of the bits of the error-corrected information frame to the original order in a rule opposite to that of the interleaver 11, and outputs the bits as a reception information frame.

Plural transmission information frames can be used in combination, like in the fourth embodiment. Specifically, a framer 15a shown in the fourth embodiment is added to the pre-stage of the interleaver 11 of the transmitter 1b. The transmitter 1b carries out the above-described FEC parity generation process, using the frame generated by the framer 15a (the frame generated by combining plural transmission information frames), thereby generating the FEC parity of the outer code and the FEC parity of the inner code. The framer 25a and the de-framer 26a shown in the fourth embodiment are added to the post-stage of the selector 21 and the de-interleaver 24 of the receiver 2b. The receiver 2b executes the above-described reproduction process of a reception information frame using the frame generated by the framer 25a, thereby reproducing the frame generated by the framer 15a. The de-framer 26a divides the reproduced frame to generate a reception information frame.

As explained above, the fifth embodiment is a concrete example of the application of the methods explained in the first to the fourth embodiments to the junction codes. In other words, the communication apparatus at the transmission side generates two FEC parities using two interleavers and two FEC encoders, and inserts the FEC parities into the transmission information frame and sends this frame. The communication apparatus at the reception side extracts the error information frame and the two FEC parities from the received signal. Furthermore, the two interleavers rearrange the order of bits of the extracted information frame based on the same rule as that used at the transmission side. The two FEC decoders correct the information frame whose bit positions are rearranged, using the extracted FEC parities. Finally, the two de-interleavers rearrange the bits of the error-corrected reception information frame, based on the rule opposite to that used above. The frame obtained as a result of rearranging the bits is output as the reproduced reception information frame. Consequently, a burst error can be corrected satisfactorily, without requiring the communication apparatus at the transmission side to send the interleaved signal.

While the error correction optical communication system according to the fifth embodiment includes two junction codes of an outer code and an inner code, this system can also include three or more codewords.

When a product code including two or more codewords is used, similar effects can be obtained by carrying out interleaving and de-interleaving in a similar manner to that of the fifth embodiment.

According to an aspect of the present invention, a burst error can be corrected satisfactorily, without requiring the communication apparatus at the transmission side to send the interleaved signal. Moreover, error correction capacity of errors due to the junction codes and the product codes can be improved.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:
1. A communication apparatus that comprises a transmitting unit and a receiving unit each of which has an error correction function, and transmits and receives respectively a information frame sufficiently longer than a codeword, wherein
the transmitting unit includes
a first interleaver that rearranges positions of bits in an information frame based on a predetermined rule;
an error correction encoder that carries out an error correction encoding to the information frame whose bit positions have been rearranged; and
a transmission signal generator that inserts error correction parities obtained by the encoding operation using the first interleaved information frame into predetermined positions of the information frame, thereby generating a transmission signal, and
the receiving unit includes
a reception signal extractor that receives the transmission signal and extracts a part corresponding to the information frame and the other part corresponding to the error correction parities, from the thus received transmission signal;
a second interleaver that rearranges positions of the bits in the information frame part based on the same rule as that of the first interleaver;
a decoder that corrects an error of bits rearranged by the second interleaver, based on the error correction parity part; and
a de-interleaver that reproduces an information frame by returning positions of the error-corrected bits to the original bit positions.

2. The communication apparatus according to claim 1, wherein the information frame is an Ethernet® frame.

3. The communication apparatus according to claim 1, wherein a Reed-Solomon error correction system is used for carrying out the error correction encoding operation.

4. A communication apparatus that comprises a transmitting unit and a receiving unit each of which has an error correction function, and transmits and receives respectively an information frame that is sufficiently short to an extent that a burst error cannot be corrected satisfactorily when the information frame is interleaved as a single frame, wherein
the transmitting unit includes
a first frame generator that generates a frame sufficiently longer than a codeword, by combining a plurality of information frames;
a first interleaver that rearranges positions of bits in the frame generated by the first frame generator, based on a predetermined rule;
an error correction encoder that carries out an error correction encoding to the frame whose bit positions have been rearranged; and
a transmission signal generator that inserts error correction parities obtained by the encoding operation using the first interleaved information frame, into predetermined positions of the information frame, and
the receiving unit includes
a reception signal extractor that receives the transmission signal and extracts a part corresponding to the information frame and the other part corresponding to the error correction parities, from the thus received transmission signal;
a second frame generator that generates a frame sufficiently longer than a codeword, by combining a plurality of information frames;
a second interleaver that rearranges positions of bits in the frame generated by the second frame generator, based on the same rule as that used by the first interleaver;
a decoder that corrects an error of bits rearranged by the second interleaver, based on the error correction parity part;
a de-interleaver that returns positions of the error-corrected bits to the original bit positions; and
a frame divider that divides the error-corrected frame obtained by the de-interleaver, into a plurality of the original information frames.

5. The communication apparatus according to claim 4, wherein the information frame is an Ethernet® frame.

6. The communication apparatus according to claim 4, wherein a Reed-Solomon error correction system is used for carrying out the error correction encoding operation.

7. A transmitter that transmits an information frame sufficiently longer than a codeword, the transmitter comprising:
an interleaver that rearranges positions of bits in an information frame based on a predetermined rule;
an error correction encoder that carries out an error correction encoding to the information frame whose bit positions have been rearranged; and
a transmission signal generator that inserts error correction parities obtained by the encoding of the first interleaved information frame into predetermined positions in the information frame, thereby generating a transmission signal.

8. A transmitter that transmits an information frame that is sufficiently short to an extent that a burst error cannot be corrected satisfactorily when the information frame is interleaved as a single frame, the transmitter comprising:
a frame generator that generates a frame sufficiently longer than a codeword, by combining a plurality of information frames;
an interleaver that rearranges positions of bits in the frame generated by the frame generator, based on a predetermined rule;
an error correction encoder that carries out an error correction encoding to the frame whose bit positions have been rearranged; and
a transmission signal generator that inserts error correction parities obtained by the encoding operation using the first interleaved information frame, into predetermined positions of the information frame.

9. A receiver that has an error correction function, and receives an information frame sufficiently longer than a codeword, the receiver comprising:
a reception signal extractor that extracts a part corresponding to an information frame and a part corresponding to an error correction parity, from a reception signal;
an interleaver that rearranges positions of the bits in the information frame part, based on the same rule as that used at a transmitter side;
a decoder that corrects an error of bits using the interleaved information frame rearranged by the interleaver, based on the error correction parity part; and
a de-interleaver that reproduces an information frame by returning positions of the error-corrected bits to the original bit positions.

10. A receiver that has an error correction function, and receives an information frame that is sufficiently short to an extent that a burst error cannot be corrected satisfactorily when the information frame is interleaved as a single frame, the receiver comprising:
a reception signal extractor that extracts a part corresponding to an information frame and a part corresponding to a plurality of error correction parities, from a reception signal;

a frame generator that generates a frame sufficiently longer than a codeword, by combining a plurality of information frames;

an interleaver that rearranges positions of bits in the frame generated by the frame generator, based on the same rule as that used at a transmitter side;

a decoder that corrects an error of bits using the interleaved information frame rearranged by the interleaver, based on the error correction parity part;

a de-interleaver that returns positions of the error-corrected bits to the original bit positions; and a frame divider that divides the error-corrected frame obtained by the de-interleaver, into a plurality of original information frames.

11. An error-correction optical communication system that comprises a transmitting unit and a receiving unit each of which has an error correction function, and transmits and receives respectively a information frame sufficiently longer than a codeword, wherein the transmitting unit includes a first interleaver that rearranges positions of bits in an information frame based on a predetermined rule;

an error correction encoder that carries out an error correction encoding to the information frame whose bit positions have been rearranged; and a transmission signal generator that inserts error correction parities obtained by the encoding operation using the first interleaved information frame into predetermined positions of the information frame, thereby generating a transmission signal, and the receiving unit includes a reception signal extractor that receives the transmission signal and extracts a part corresponding to the information frame and the other part corresponding to the error correction parities, from the thus received transmission signal;

a second interleaver that rearranges positions of the bits in the information frame part based on the same rule as that of the first interleaver;

a decoder that corrects an error of bits rearranged by the second interleaver, based on the error correction parity part; and a de-interleaver that reproduces an information frame by returning positions of the error-corrected bits to the original bit positions.

12. The error-correction optical communication system according to claim 11, wherein the information frame is an Ethernet® frame.

13. The error-correction optical communication system according to claim 11, wherein a Reed-Solomon error correction system is used for carrying out the error correction encoding operation.

14. An error-correction optical communication system that comprises a transmitting unit and a receiving unit each of which has an error correction function, and transmits and receives respectively an information frame that is sufficiently short to an extent that a burst error cannot be corrected satisfactorily when the information frame is interleaved as a single frame, wherein the transmitting unit includes a first frame generator that generates a frame sufficiently longer than a codeword, by combining a plurality of information frames;

a first interleaver that rearranges positions of bits in the frame generated by the first frame generator, based on a predetermined rule;

an error correction encoder that carries out an error correction encoding to the frame of whose bit positions have been rearranged; and a transmission signal generator that inserts error correction parities obtained by the encoding operation using the first interleaved information frame, into predetermined positions of the information frame, and the receiving unit includes a reception signal extractor that receives the transmission signal and extracts a part corresponding to the information frame and the other part corresponding to the error correction parities, from the thus received transmission signal;

a second frame generator that generates a frame sufficiently longer than a codeword, by combining a plurality of information frames;

a second interleaver that rearranges positions of bits in the frame generated by the second frame generator, based on the same rule as that used by the first interleaver;

a decoder that corrects an error of bits rearranged by the second interleaver, based on the error correction parity part;

a de-interleaver that returns positions of the error-corrected bits to the original bit positions; and a frame divider that divides the error-corrected frame obtained by the de-interleaver, into a plurality of the original information frames.

15. The error-correction optical communication system according to claim 14, wherein the information frame is an Ethernet® frame.

16. The error-correction optical communication system according to claim 14, wherein a Reed-Solomon error correction system is used for carrying out the error correction encoding operation.

17. A communication apparatus that comprises a transmitting unit and a receiving unit each of which has an error correction function, and transmits and receives respectively an information frame sufficiently longer than a codeword, wherein the transmitting unit includes a first interleaver that rearranges positions of bits in an information frame based on a predetermined rule;

a first error correction encoder that carries out an error correction encoding using an outer code to the information frame whose bit positions have been rearranged;

a second interleaver that rearranges bit positions of the output of the first error correction encoder based on a predetermined rule;

a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal, and the receiving unit includes a reception signal extractor that receives the transmission signal, and extracts a part corresponding to the information frame, a part corresponding to the first error correction parity, and a part corresponding to the second error correction parity, from the thus received transmission signal;

a third interleaver that rearranges positions of the bits in the information frame part based on the same rule as that of the first interleaver;

a first adder that inserts a first error correction parity extracted by the reception signal extractor into the signals rearranged by the third interleaver;

a fourth interleaver that rearranges the output of the first adder based on the same rule as that of the second interleaver;

a second adder that inserts a second error correction parity extracted by the reception signal extractor into the signals rearranged by the fourth interleaver;

a first decoder that corrects an error of the output of the second adder, using the second error correction parity included in the processed output;

a first de-interleaver that rearranges the signals of which error is corrected by the first decoder, in the order opposite to that of the rearrangement executed by the second interleaver;

a second decoder that corrects an error of the output of the first de-interleaver, using the first error correction parity included in the processed output; and the second de-interleaver that reproduces an information frame by returning positions of the error-corrected bits to the original bit positions by rearranging the signals of which error is corrected by the output of the second decoder, in the order opposite to that of the rearrangement executed by the first interleaver.

18. The communication apparatus according to claim 17, wherein a Reed-Solomon error correction system is used for carrying out the error correction encoding operation.

19. The communication apparatus according to claim 17, wherein the communication apparatus employs a junction code including two or more codewords for the error correction encoding.

20. The communication apparatus according to claim 17, wherein the communication apparatus employs a product code including two or more codewords for the error correction encoding.

21. The communication apparatus according to claim 17, wherein the information frame is an Ethernet® frame.

22. A communication apparatus that comprises a transmitting unit and a receiving unit each of which has an error correction function, and transmits and receives respectively an information frame that is sufficiently short to an extent that a burst error cannot be corrected satisfactorily when the information frame is interleaved as a single frame, wherein the transmitting unit includes a first frame generator that generates a frame sufficiently longer than a codeword by combining a plurality of information frames;

a first interleaver that rearranges positions of bits in an information frame generated by the first frame generator, based on a predetermined rule;

a first error correction encoder that carries out an error correction encoding using an outer code to the information frame whose bit positions have been rearranged;

a second interleaver that rearranges bit positions of the output of the first error correction encoder based on a predetermined rule;

a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal, and the receiving unit includes a reception signal extractor that receives the transmission signal, and extracts a part corresponding to the information frame, a part corresponding to the first error correction parity, and a part corresponding to the second error correction parity, from the thus received transmission signal;

a second frame generator that generates a frame sufficiently longer than a codeword by combining a plurality of information frames;

a third interleaver that rearranges positions of the bits in the information frame generated by the second frame generator, based on the same rule as that of the first interleaver;

a first adder that inserts a first error correction parity extracted by the reception signal extractor into the signals rearranged by the third interleaver;

a fourth interleaver that rearranges the output of the first adder based on the same rule as that of the second interleaver;

a second adder that inserts a second error correction parity extracted by the reception signal extractor into the signals rearranged by the fourth interleaver;

a first decoder that corrects an error of the output of the second adder, using the second error correction parity included in the processed output;

a first de-interleaver that rearranges the signals of which error is corrected by the first decoder, in the order opposite to that of the rearrangement executed by the second interleaver;

a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

23. The communication apparatus according to claim 22, wherein a Reed-Solomon error correction system is used for carrying out the error correction encoding operation.

24. The communication apparatus according to claim 22, wherein the communication apparatus employs a junction code including two or more codewords for the error correction encoding.

25. The communication apparatus according to claim 22, wherein the communication apparatus employs a product code including two or more codewords for the error correction encoding.

26. The communication apparatus according to claim 22, wherein the information frame is an Ethernet® frame.

27. A transmitter that transmits an information frame sufficiently longer than a codeword, the transmitter comprising:

a first interleaver that rearranges positions of bits in an information frame based on a predetermined rule;

a first error correction encoder that carries out an error correction encoding using an outer code to the information frame whose bit positions have been rearranged;

a second interleaver that rearranges bit positions of the output of the first error correction encoder based on a predetermined rule;

a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal.

28. A receiver that has an error correction function and that receives a signal transmitted from the transmitter according to claim 27, the receiver comprising:
   a reception signal extractor that receives the transmission signal, and extracts a part corresponding to the information frame, a part corresponding to the first error correction parity, and a part corresponding to the second error correction parity, from the thus received transmission signal;
   a third interleaver that rearranges positions of the bits in the information frame, based on the same rule as that of the first interleaver;
   a first adder that inserts a first error correction parity extracted by the reception signal extractor into the signals rearranged by the third interleaver;
   a fourth interleaver that rearranges the output of the first adder based on the same rule as that of the second interleaver;
   a second adder that inserts a second error correction parity extracted by the reception signal extractor into the signals rearranged by the fourth interleaver;
   a first decoder that corrects an error of the output of the second adder, using the second error correction parity included in the processed output;
   a first de-interleaver that rearranges the signals of which error is corrected by the first decoder, in the order opposite to that of the rearrangement executed by the second interleaver;
   a second decoder that corrects an error of the output of the first de-interleaver, using the first error correction parity included in the processed output; and
   a second de-interleaver that reproduces an information frame by returning positions of the error-corrected bits to the original bit positions by rearranging the signals of which error is corrected by the output of the second decoder, in the order opposite to that of the rearrangement executed by the first interleaver.

29. A transmitter that transmits an information frame that is sufficiently short to an extent that a burst error cannot be corrected satisfactorily when the information frame is interleaved as a single frame, the transmitter comprising:
   a first frame generator that generates a frame sufficiently longer than a codeword by combining a plurality of information frames;
   a first interleaver that rearranges positions of bits in an information frame generated by the first frame generator, based on a predetermined rule;
   a first error correction encoder that carries out an error correction encoding using an outer code to the information frame whose bit positions have been rearranged;
   a second interleaver that rearranges bit positions of the output of the first error correction encoder based on a predetermined rule;
   a second error correction encoder that carries out an error correction encoding using an inner code to the output of the second interleaver; and
   a transmission signal generator that inserts a first error correction parity obtained by the first error correction encoding and a second error correction parity obtained by the second error correction encoding into predetermined positions of the information frame, thereby generating a transmission signal.

30. A receiver that has an error correction function and that receives a signal transmitted from the transmitter according to claim 29, the receiver comprising:
   a reception signal extractor that receives the transmission signal, and extracts a part corresponding to the information frame, a part corresponding to the first error correction parity, and a part corresponding to the second error correction parity, from the thus received transmission signal;
   a second frame generator that generates a frame sufficiently longer than a codeword by combining a plurality of information frames;
   a third interleaver that rearranges positions of the bits in the information frame generated by the second frame generator, based on the same rule as that of the first interleaver;
   a first adder that inserts a first error correction parity extracted by the reception signal extractor into the signals rearranged by the third interleaver;
   a fourth interleaver that rearranges the output of the first adder based on the same rule as that of the second interleaver;
   a second adder that inserts a second error correction parity extracted by the reception signal extractor into the signals rearranged by the fourth interleaver;
   a first decoder that corrects an error of the output of the second adder, using the second error correction parity included in the processed output;
   a first de-interleaver that rearranges the signals of which error is corrected by the first decoder, in the order opposite to that of the rearrangement executed by the second interleaver;
   a second decoder that corrects an error of the output of the first de-interleaver, using the first error correction parity included in the processed output; and
   a second de-interleaver that reproduces an information frame by returning positions of the error-corrected bits to the original bit positions by rearranging the signals of which error is corrected by the output of the second decoder, in the order opposite to that of the rearrangement executed by the first interleaver.

31. An error correction optical communication system that has an error correction function, and transmits and receives respectively an information frame sufficiently longer than a codeword, wherein
   a communication apparatus at an information frame transmission side includes
      a first interleaver that rearranges positions of bits in an information frame based on a predetermined rule;
      a first error correction encoder that carries out an error correction encoding using an outer code to the information frame whose bit positions have been rearranged;
      a second interleaver that rearranges bit positions of the output of the first error correction encoder based on a predetermined rule;
      a second error correction encoder that carries out an error correction encoding using an inner code to the output of the second interleaver; and
      a transmission signal generator that inserts a first error correction parity obtained by the first error correction encoding and a second error correction parity obtained by the second error correction encoding into predetermined positions of the information frame, thereby generating a transmission signal, and
   a communication apparatus at an information frame reception side includes
      a reception signal extractor that receives the transmission signal, and extracts a part corresponding to the information frame, a part corresponding to the first error correction parity, and a part corresponding to the second error correction parity, from the thus received transmission signal;
      a third interleaver that rearranges positions of the bits in the information frame part based on the same rule as that of the first interleaver;

a first adder that inserts a first error correction parity extracted by the reception signal extractor into the signals rearranged by the third interleaver;

a fourth interleaver that rearranges the output of the first adder based on the same rule as that of the second interleaver;

a second adder that inserts a second error correction parity extracted by the reception signal extractor into the signals rearranged by the fourth interleaver;

a first decoder that corrects an error of the output of the second adder, using the second error correction parity included in the processed output;

a first de-interleaver that rearranges the signals of which error is corrected by the first decoder, in the order opposite to that of the rearrangement executed by the second interleaver;

a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

32. The error-correction optical communication system according to claim 31, wherein a Reed-Solomon error correction system is used for carrying out the error correction encoding operation.

33. The error correction optical communication system according to claim 31, wherein the communication apparatus employs a junction code including two or more codewords for the error correction encoding.

34. The error correction optical communication system according to claim 31, wherein the communication apparatus employs a product code including two or more codewords for the error correction encoding.

35. The error correction optical communication system according to claim 31, wherein the information frame is an Ethernet® frame.

36. An error correction optical communication system that has an error correction function, and transmits and receives respectively an information frame that is sufficiently short to an extent that a burst error cannot be corrected satisfactorily when the information frame is interleaved as a single frame, wherein a communication apparatus at an information frame transmission side includes a first frame generator that generates a frame sufficiently longer than a codeword by combining a plurality of information frames;

a first interleaver that rearranges positions of bits in an information frame generated by the first frame generator, based on a predetermined rule;

a first error correction encoder that carries out an error correction encoding using an outer code to the information frame whose bit positions have been rearranged;

a second interleaver that rearranges bit positions of the output of the first error correction encoder based on a predetermined rule;

a second error correction encoder that carries out an error correction encoding using an inner code to the output of the second interleaver; and a transmission signal generator that inserts a first error correction parity obtained by the first error correction encoding and a second error correction parity obtained by the second error correction encoding into predetermined positions of the information frame, thereby generating a transmission signal, and a communication apparatus at an information frame reception side includes a reception signal extractor that receives the transmission signal, and extracts a part corresponding to the information frame, a part corresponding to the first error correction parity, and a part corresponding to the second error correction parity, from the thus received transmission signal;

a second frame generator that generates a frame sufficiently longer than a codeword by combining a plurality of information frames;

a third interleaver that rearranges positions of the bits in the information frame generated by the second frame generator, based on the same rule as that of the first interleaver;

a first adder that inserts a first error correction parity extracted by the reception signal extractor into the signals rearranged by the third interleaver;

a fourth interleaver that rearranges the output of the first adder based on the same rule as that of the second interleaver;

a second adder that inserts a second error correction parity extracted by the reception signal extractor into the signals rearranged by the fourth interleaver;

a first decoder that corrects an error of the output of the second adder, using the second error correction parity included in the processed output;

a first de-interleaver that rearranges the signals of which error is corrected by the first decoder, in the order opposite to that of the rearrangement executed by the second interleaver;

a second decoder that corrects an error of the output of the first de-interleaver, using the first error correction parity included in the processed output; and a second de-interleaver that reproduces an information frame by returning positions of the error-corrected bits to the original bit positions by rearranging the signals of which error is corrected by the output of the second decoder, in the order opposite to that of the rearrangement executed by the first interleaver.

37. The error-correction optical communication system according to claim 36, wherein a Reed-Solomon error correction system is used for carrying out the error correction encoding operation.

38. The error correction optical communication system according to claim 36, wherein the communication apparatus employs a junction code including two or more codewords for the error correction encoding.

39. The error correction optical communication system according to claim 36, wherein the communication apparatus employs a product code including two or more codewords for the error correction encoding.

40. The error correction optical communication system according to claim 36, wherein the information frame is an Ethernet® frame.

* * * * *